(12) United States Patent
Horan

(10) Patent No.: US 7,145,400 B2
(45) Date of Patent: Dec. 5, 2006

(54) PHASE LOCKED LOOP WITH A SWITCH CAPACITOR RESISTOR IN THE LOOP FILTER

(75) Inventor: John M. Horan, Cork (IE)

(73) Assignee: Ceva Services Limited, Dublin (IE)

( * ) Notice: Subject to any disclaimer, the term of this patent is extended or adjusted under 35 U.S.C. 154(b) by 102 days.

(21) Appl. No.: 11/040,280

(22) Filed: Jan. 20, 2005

(65) Prior Publication Data

US 2006/0119444 A1 Jun. 8, 2006

Related U.S. Application Data

(60) Provisional application No. 60/633,232, filed on Dec. 2, 2004.

(51) Int. Cl.
  *H03L 7/085* (2006.01)
  *H03L 7/093* (2006.01)
(52) U.S. Cl. .......................................... 331/17; 327/156
(58) Field of Classification Search .................... 331/8, 331/17, 18, 25; 327/156–159
See application file for complete search history.

(56) References Cited

U.S. PATENT DOCUMENTS

| | | | |
|---|---|---|---|
| 5,659,269 A | * | 8/1997 | Myers .......................... 331/17 |
| 6,184,726 B1 | | 2/2001 | Haeberli et al. |
| 6,185,119 B1 | | 2/2001 | Haeberli et al. |
| 6,370,075 B1 | | 4/2002 | Haeberli et al. |
| 6,420,917 B1 | | 7/2002 | Klemmer |
| 6,760,262 B1 | | 7/2004 | Haeberli et al. |
| 6,980,060 B1 | * | 12/2005 | Boerstler et al. ............. 331/17 |

OTHER PUBLICATIONS

Applied Ideas, Your Electronic Ideas Could Reward You, "Switched Capacitor Filters for PLL", Electronic Engineering—May 1983 (pp. 27-28).

Daniel Asta, et al., "Analysis of a Hybrid Analog/Switched-Capacitor Phase-Locked Loop", IEEE Transactions on Circuits and Systems, vol. 37, No. 2, Feb. 1990 (pp. 183-197).

* cited by examiner

*Primary Examiner*—David Mis

(57) ABSTRACT

A filter couples an output of a phase detector to an input of a voltage controlled oscillator. The filter has a first capacitor and a switch capacitor resistor that is in series with the first capacitor, between the first capacitor and the output of the phase detector. The switch capacitor resistor is to display a resistance that is obtained by switching back and forth a second capacitor to the first capacitor and to the phase detector output. Other embodiments are also described and claimed.

20 Claims, 3 Drawing Sheets

PHASE LOCKED LOOP WITH A SWITCH CAPACITOR RESISTOR IN THE LOOP FILTER

This application claims the benefit of the earlier filing date of U.S. Provisional Application Ser. No. 60/633,232 filed Dec. 2, 2004.

BACKGROUND

Phased locked loop circuits (PLLs) are typically used whenever a periodic signal is to be generated whose frequency is an accurate multiple of the frequency of a very stable and low noise reference signal. A PLL is also used where the phase of an output signal has to track the phase of the reference signal. Applications include the generation of local oscillator signals in radio receivers are transmitters, as well as in clock recovery of digital communication systems.

The PLL is a closed loop feedback control system that continuously tries to reduce the error between the frequency or phase of its output signal and that of the reference. A typical PLL has what is referred to as a loop filter that connects a phase detector to a voltage controlled oscillator (VCO). The phase detector responds to the phase error between the reference and a feedback signal derived from the output, by making adjustments to a voltage signal in proportion to the phase error. Rather than directly applying the voltage signal to the input of the VCO, however, the signal is conditioned by the filter to produce the control voltage that adjusts the output frequency of the VCO. The filter is designed to help maintain the control loop stable, so that the loop does not enter an oscillatory condition. The filter may be viewed as smoothing out the input voltage to the VCO. The input voltage to the VCO adjusts the output frequency until a, for example, reference clock edge and a feedback clock edge are aligned.

In certain types of PLLs, stabilization using the loop filter is typically achieved by including a resistor in series with a capacitor, which together are in parallel with the output of the phase detector. Circuit designers have been faced with the challenge of reducing the size of such a PLL, particularly where it is implemented by advanced, small feature size integrated circuit manufacturing techniques.

BRIEF DESCRIPTION OF THE DRAWINGS

The embodiments of the invention are illustrated by way of example and not by way of limitation in the figures of the accompanying drawings in which like references indicate similar elements. It should be noted that references to "an" embodiment of the invention in this disclosure are not necessarily to the same embodiment, and they mean at least one.

DETAILED DESCRIPTION

Figure 1:
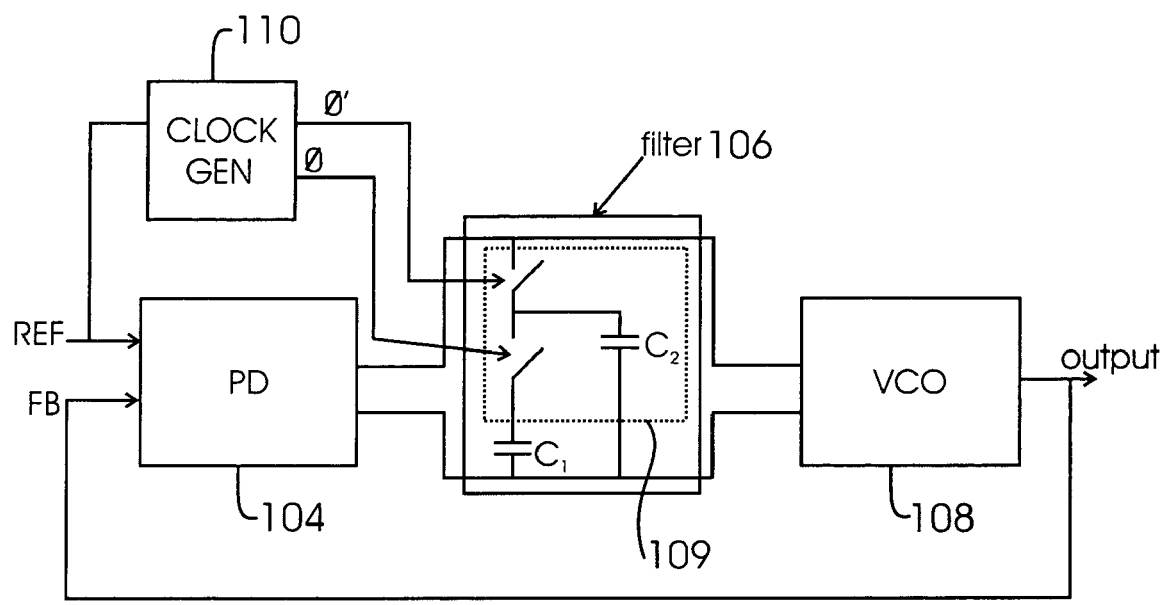
FIG. 1 shows a simplified schematic diagram of part of a PLL that features a loop filter with a switch capacitor resistor.

According to an embodiment of the invention, a modification to the loop filter is described which achieves significant area reduction in the loop filter, without a degradation in performance that would normally be associated with the area reduction. Another embodiment of the invention lies in modifying the loop filter to make it possible for the filter to automatically adjust its characteristics appropriately, in response to a wide range of PLL input reference frequencies. A simplified schematic diagram of an embodiment of the invention is shown in FIG. 1. A loop filter 106 that is coupled between a phase detector (PD) 104 and VCO 108 is modified so that a switching capacitor circuit 109 is in series with the capacitor $C_1$, between $C_1$ and the input of the VCO 108. The switching capacitor circuit 109 has a second capacitor $C_2$ that is coupled to the power return node at one end, and at its other end is alternatively coupled to $C_1$ in one state and the VCO input in another state. This may be achieved by a pair of solid state switches as shown, that are controlled by non-overlapping clock signals phi and phi'. These non-overlapping clock signals may be generated by a clock generator 110 that derives from the input reference signal REF. Operation of the circuit in FIG. 1 may be understood following a description below of a basic PLL and its associated control loop, as well as appreciating the significance of the loop filter in the control loop.

Figure 2:
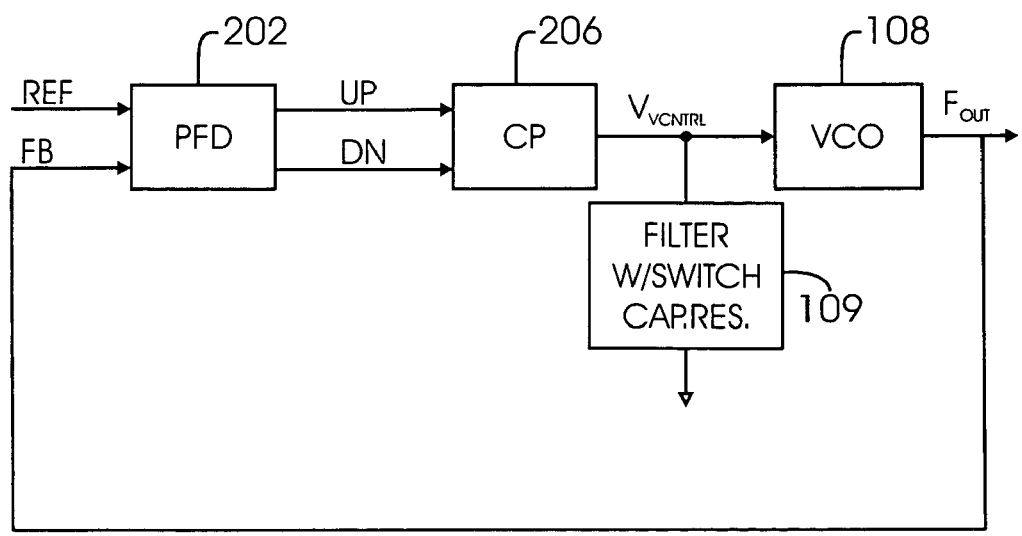
FIG. 2 is a block diagram of a PLL featuring a filter with a switch capacitor resistor.

The basic building blocks of an example PLL, without input and feedback frequency dividers, can be seen in FIG. 2. This PLL works in the following manner. A phase frequency detector (PFD) 202 detects the phase error between its input edges (REF & FB) and produces voltage pulses, the widths of which are proportional to the phase error. These pulses are converted to electrical current pulses by a charge pump (CP) 206. The electrical current pulses are then conditioned by the filter 109 to produce a control voltage ($V_{CNTRL}$). This voltage adjusts the output frequency of the voltage-controlled oscillator (VCO) 108 until the reference edge (REF) and the fed-back clock edge (FB) are aligned.

The PLL as described above is a closed loop system. It has a number of constraints. These include stability and bandwidth requirements. By examining its open-loop transfer function, some of a PLLs stability concerns and how these are affected by the PLL components can be appreciated. The transfer function which relates the input to output phase ($\phi i$ to $\phi o$) of the transfer function may be $$\frac{\phi_O}{\phi_I} = \frac{I_P}{2\pi} \times Z(s) \times \frac{K_{VCO}}{s} \quad (1)$$

In this expression, $I_P$ is the charge pump current, $K_{VCO}$ is the frequency sensitivity of the VCO 108 and $Z(s)$ is the impedance of the filter 109.

Figure 3:
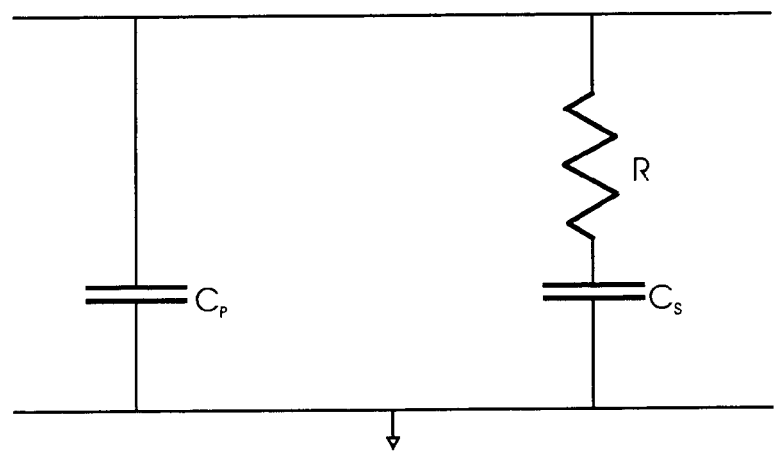
FIG. 3 shows a conventional loop filter with parallel capacitors and a passive resistor.

For a conventional, second order passive filter, as shown in FIG. 3, the impedance of the loop filter 109 may be given by $$Z(s) = \frac{sRC_S + 1}{(C_P + C_S)s\left(1 + \frac{sC_P C_S R}{C_P + C_S}\right)} \quad (2)$$

Based on Equation (1) and (2) above, it can be seen that there is a zero at $1/RC_S$ and a pole at $(C_P+C_S)/(C_PC_SR)$, or because $C_S \gg C_P$ the pole is approximated by $1/RC_P$.

Figure 4:
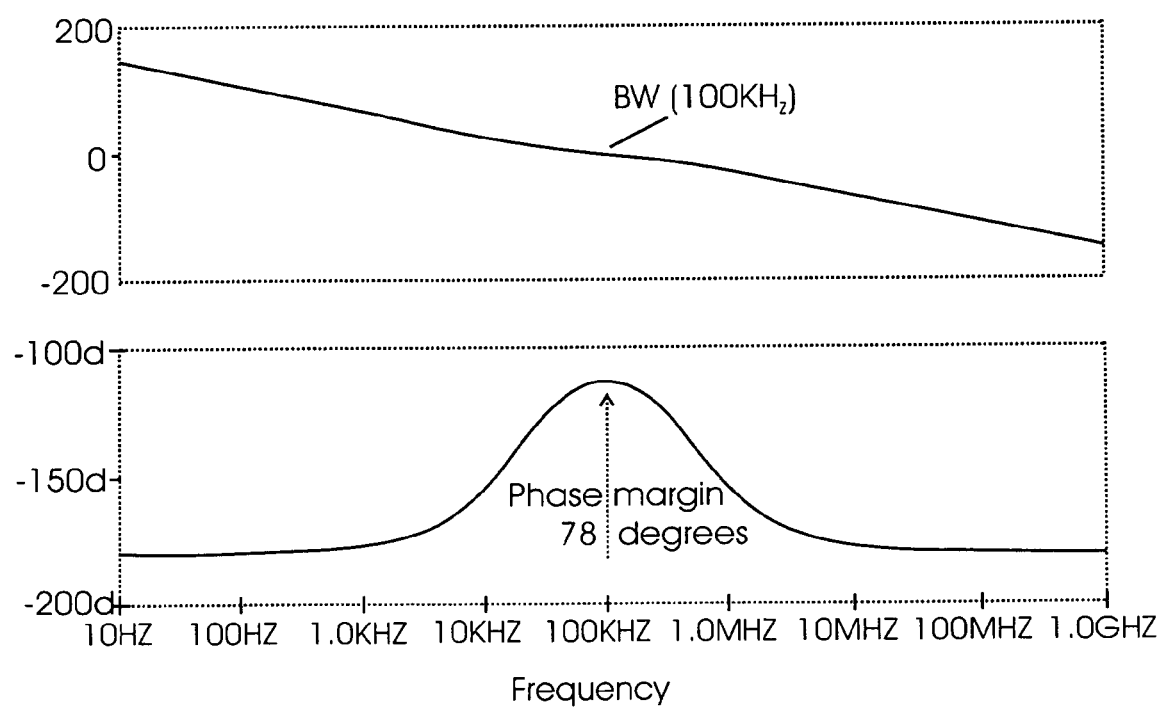
FIG. 4 shows a plot of the open loop transfer function of an example PLL.

A graphical plot of a typical transfer function for a PLL is shown in FIG. 4, for an input reference frequency of one MHz and an output of 200 MHz. As an example, the parameters for such a system might be

TABLE D

| Ip | R | Cs | Cp | $K_{VCO}$ |
|---|---|---|---|---|
| 10 microA | 22 Kohms | 350 pF | 15 pF | 500 MHz/V |

From FIG. 4, the Bandwidth (BW) of the system may be set at 100 KHz, which is ten times lower than the input frequency for the stability of the system. This example ratio of 10:1 allows for the fact that the PLL control loop may be viewed as a sampled data system with the phase error being sampled at the reference frequency. Thus the system response time (related to the reciprocal of the BW) should be somewhat less than the reference frequency to avoid instability due to under sampling.

According to an embodiment of the invention, the size of the filter may be reduced by realizing that its size is dominated by the size of the capacitor $C_s$ (FIG. 3). To reduce the size of the filter, the size of the capacitor $C_s$ is reduced. However, this also decreases the capacitance exhibited by $C_s$, so that to maintain the position of the important pole and zero described above, it may be necessary to increase the value of the filter resistor R. To maintain a similar magnitude response in the transfer function (FIG. 4), the current of the charge pump 206 may also need to be scaled down. Following this thinking, a potential system which has a substantially identical transfer function to the above may be given by

TABLE G

| Ip | R | Cs | Cp | $K_{VCO}$ |
|---|---|---|---|---|
| 1 microA | 220 Kohms | 35 pF | 1.5 pF | 500 MHz/V |

The system above reduces the area of the loop filter by a factor of 10, however, it has a drawback in that the increased filter resistance at 220 KΩ generates a relatively large amount of thermal noise, which directly modulates the sensitive input node of the VCO 108 and thus degrades the phase noise of the PLL.

According to an embodiment of the invention, the modification to the filter 106, which maintains its small size, is to replace the resistor R with a switching capacitor circuit 109, as shown in FIG. 1 (where $C_1$ may be viewed as being analogous to $C_s$ of FIG. 3). In other words, the resistor R is replaced with a switch capacitor resistor that is preferably composed of a pair of transistor switches that share a node with the capacitor $C_2$ referenced to a power supply return node (e.g., ground) as shown in FIG. 2. Note that the filter 106 may also be equipped with a further capacitor $C_p$ that is also in parallel with the output of the phase detector 104 or the input of the VCO 108.

Figure 5:
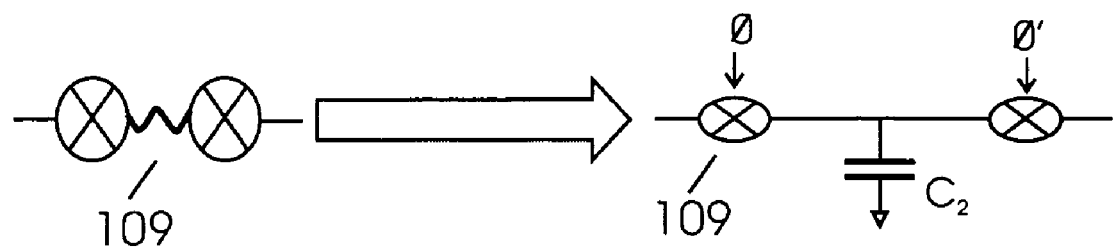
FIG. 5 shows an example modified loop filter, according to an embodiment of the invention.

The effective resistance of the switching capacitor circuit 109, redrawn in FIG. 5, is given by $R=T_s/C_2$ where $T_s$ is the period of the switching clock phi, phi'. Note that such a switch capacitor resistor does not generate the same level of noise that a linear resistor of the same value would typically generate, and therefore helps maintain the performance of the PLL.

In yet a further embodiment of the invention, the switch capacitor resistor is clocked from a derivative of the reference clock. This allows the pole and zero of the open loop transfer function to be moved along with the reference clock, and thus positions the pole and zero appropriately for a range of reference frequencies (to maintain a desirable phase margin for stability). In other words, the frequency response of the loop filter is automatically tuned for a wide range of reference frequencies.

Figure 6:
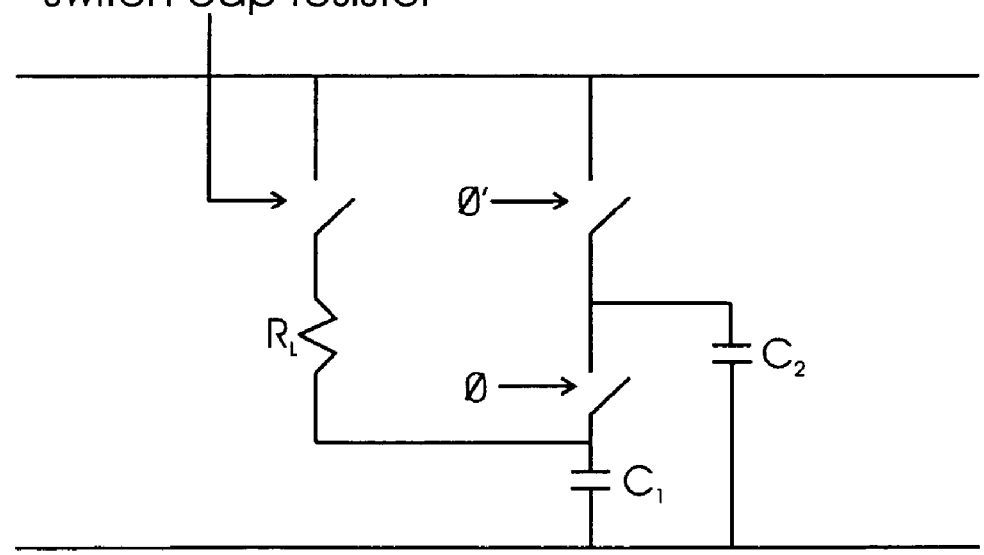
FIG. 6 shows an implementation of a switch capacitor resistor for the loop filter.

FIG. 6 shows a simplified schematic of another embodiment of the loop filter, featuring a selectable "linear" resistor $R_L$ in parallel with the switch capacitor resistor. The term linear is used here merely to distinguish the "switching" aspect of the switch capacitor resistor. The linear (or "normal") resistor $R_L$ may be implemented by, for example, a passive device or by properly biased transistor. In such a loop filter, either the switch cap resistor or alternatively the linear resistor is selected to be in series with the capacitor $C_1$. This may be achieved by turning off the switches (normally clocked by phi and phi'), and switching in the linear resistor $R_L$ as shown. A purpose for having this option is as follows. At relatively high reference frequencies, the time constant of the switching in the switch capacitor resistor becomes comparable to the bandwidth of the PLL loop. Accordingly, there is, in that case, an increased risk of destabilizing the loop. At the same time, at relatively high reference frequencies, a linear resistor $R_L$ in series with $C_1$ works well as part of the loop filter, because the resistance needed in series with $C_1$ is relative low and so thermal noise from such a resistor is not as much of a problem. For example, there may be two reference frequency ranges defined, one up to 50 MHz and another beyond. Up to 50 MHz it is the switch capacitor resistor that is used. Beyond 50 MHz, the switch cap resistor is replaced with a combination of one or more linear resistors.

The embodiments of the PLL described above may be implemented in a complementary metal oxide semiconductor (CMOS) fabrication process. The passive capacitors would be MOS devices while the switching circuits would include CMOS transmission gates. Other microelectronic fabrication technologies may also be used to implement the PLL.

The PLL and loop filter designs described above may be embodied in an electronic design automation/computer aided design file format that is popular in the industry for transferring or archiving a mask drawing and layout design of an integrated circuit. An example is a GDS file that describes the physical layout and identifies the components of the PLL and its loop filter for a particular fabrication technology. The GDS file may be stored in a machine-readable medium, such as a CDROM or a distributed medium such as an Internet transfer. Such a medium would have stored therein instructions which, when executed by a processor, describe the PLL circuit design and its loop filter according to any of the embodiments mentioned above.

The invention is not limited to the specific embodiments described above. For example, the switch capacitor resistor may be implemented with more than one passive capacitor that is switched to yield the desired effective resistance and/or open loop transfer function. In another alternative, more than one linear resistor may be coupled in parallel with the switch capacitor resistor (e.g., a selectable bank of resistors), and more than two reference frequency ranges can be defined for which a resistance selection can be made. Accordingly, other embodiments are within the scope of the claims.

What is claimed is:

1. A phase-locked loop circuit, comprising:
a voltage controlled oscillator (VCO);
a phase detector to respond to a phase difference between a reference signal and a feedback signal derived from an output of the VCO; and
a loop filter that couples an output of the phase detector to an input of the VCO, the loop filter having (a) a first capacitor coupled to a power return node, and (b) a switching capacitor circuit in series with the first capacitor between the first capacitor and the input of the VCO, the switching capacitor circuit having (a) a second capacitor coupled to the power return node, and (b) a switching circuit that alternatively couples the second capacitor to the first capacitor in one state and the VCO input in another state.

2. The circuit of claim 1 wherein the phase detector comprises a phase-frequency detector (PFD) to compare the reference and feedback signals, and a charge pump controlled by a pair of outputs of the PFD, wherein the phase detector output is an output of the charge pump.

3. The circuit of claim 2 wherein the loop filter further comprises a third capacitor coupled in parallel with the output of the phase detector.

4. The circuit of claim 1 wherein the loop filter further comprises a third capacitor coupled in parallel with the output of the phase detector.

5. The circuit of claim 1 further comprising:
a clock generator to generate a pair of non-overlapping clock signals that are to control operation of the switching circuit.

6. The circuit of claim 5 wherein a frequency of the clock signals and a capacitance of the second capacitor determine a resistance of the loop filter that is between the first capacitor and the VCO input.

7. The circuit of claim 5 wherein the clock generator is to generate the clock signals as derived from the reference signal.

8. The circuit of claim 5 wherein the clock generator is to generate the clock signals as derived from the reference signal so that a pole and a zero of the loop filter change as a frequency of the reference signal changes.

9. The circuit of claim 1 wherein the first and second capacitors are MOS devices, and the switching circuit has a CMOS transmission gate.

10. The circuit of claim 1 further comprising a selectable linear resistor in parallel with the switching capacitor circuit.

11. A method for operating a feedback loop, comprising:
generating an oscillating output signal in accordance with a voltage signal;
detecting a phase difference between a reference signal and a feedback signal, the feedback signal having been derived from the output signal;
updating the voltage signal according to the detected phase difference; and
filtering the voltage signal using a parallel-coupled filter having (a) a first capacitor, and (b) a switching capacitor circuit in series with the first capacitor, wherein the switching capacitor circuit has (a) a second capacitor, and (b) a switching circuit that alternatively couples the second capacitor to the first capacitor in one state and the voltage signal in another state.

12. The method of claim 11 further comprising:
generating a pair of non-overlapping clock signals that control the alternative coupling of the second capacitor to the first capacitor and the voltage signal.

13. The method of claim 12 wherein a frequency of the clock signals is derived from the reference signal.

14. The method of claim 12 wherein a frequency of the clock signals is derived from the reference signal so that a pole and a zero of the filtering, that have been selected for stability and bandwidth of the feedback loop, are repositioned appropriately for a range of reference frequencies.

15. The method of claim 11 further comprising (1) deselecting the switching capacitor circuit and selecting a linear resistor to replace the switching capacitor circuit in the filter when a frequency of the reference signal is high, and (2) selecting the switching capacitor circuit and deselecting the linear resistor when the frequency is low.

16. A machine-readable medium having stored therein instructions which, when executed by a processor, describe a phase-locked loop (PLL) circuit design that comprises:
a voltage controlled oscillator (VCO);
a phase detector; and
a filter that couples an output of the phase detector to an input of the VCO, the filter having a first capacitor and a switch-capacitor resistor that is in series with the first capacitor between the first capacitor and the output of the phase detector, the switch-capacitor resistor to display a resistance that is obtained by switching back and forth a second capacitor to the first capacitor and to the phase detector output.

17. The machine-readable medium of claim 16 wherein the instructions describe the switch-capacitor resistor as using a pair of non-overlapping clock signals to control a pair of transistor switches, respectively, that share a node with the second capacitor.

18. The machine-readable medium of claim 17 wherein the instructions describe the phase detector as having an input to receive a reference signal and another input to receive a feedback signal derived from an output of the VCO,
and wherein the instructions further describe circuitry that causes a frequency of the pair of clock signals to be derived from the reference signal.

19. The machine-readable medium of claim 17 wherein the instructions describe the phase detector as having an input to receive a reference signal and another input to receive a feedback signal derived from an output of the VCO,
and wherein the instructions further describe circuitry that causes a frequency of the pair of clock signals to be derived from the reference signal so that a pole and a zero of the filter are repositioned in accordance with a range of reference frequencies.

20. The machine readable medium of claim 16 wherein the instructions describe the phase detector as having an input to receive a reference signal and another input to receive a feedback signal derived from an output of the VCO, and wherein the instructions further describe a linear resistor in parallel with the switch capacitor resistor and that is to be selected or deselected as a function of a frequency of the reference signal.

* * * * *